US006902956B2

(12) United States Patent
Jiang

(10) Patent No.: US 6,902,956 B2
(45) Date of Patent: Jun. 7, 2005

(54) METHOD AND STRUCTURE FOR MANUFACTURING IMPROVED YIELD SEMICONDUCTOR PACKAGED DEVICES

(75) Inventor: Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/041,322

(22) Filed: Jan. 7, 2002

(65) Prior Publication Data

US 2002/0058358 A1 May 16, 2002

Related U.S. Application Data

(62) Division of application No. 09/365,356, filed on Jul. 30, 1999, now Pat. No. 6,774,480.

(51) Int. Cl.[7] ........................ H01L 21/44; H01L 21/48; H01L 21/50; H01L 23/053; H01L 23/12
(52) U.S. Cl. ........................ 438/118; 438/125; 257/701
(58) Field of Search ............................... 438/118, 125; 257/666, 701

(56) References Cited

U.S. PATENT DOCUMENTS

| | | | |
|---|---|---|---|
| 4,796,078 A | 1/1989 | Phelps, Jr. et al. ............. 357/68 |
| 5,019,535 A | 5/1991 | Wojnarowski et al. ...... 437/209 |
| 5,122,858 A | 6/1992 | Mahulikar et al. ............. 357/70 |
| 5,277,972 A | 1/1994 | Sakumoto et al. ........... 428/355 |
| 5,304,842 A | 4/1994 | Farnworth et al. ........... 257/668 |
| 5,461,087 A | 10/1995 | Takahashi et al. ............. 522/80 |
| 5,461,255 A | 10/1995 | Chan et al. ................... 257/672 |
| 5,656,551 A | * 8/1997 | Corbett et al. ............... 156/291 |
| 5,773,113 A | 6/1998 | Akhter ....................... 428/41.8 |
| 5,824,182 A | 10/1998 | Sakumoto et al. ........... 156/300 |
| 5,840,598 A | 11/1998 | Grigg et al. ................. 438/118 |
| 5,852,326 A | 12/1998 | Khandros et al. ............ 257/692 |
| 5,866,949 A | 2/1999 | Schueller .................... 257/778 |
| 5,874,784 A | 2/1999 | Aoki et al. .................. 257/787 |
| 5,891,566 A | 4/1999 | Sakumoto et al. ........... 428/343 |
| 5,943,557 A | 8/1999 | Moden ....................... 438/118 |
| 5,960,260 A | 9/1999 | Umehara et al. ............. 438/118 |
| 6,002,167 A | * 12/1999 | Hatano et al. ............... 257/696 |
| 6,107,679 A | 8/2000 | Noguchi ..................... 257/678 |
| 6,169,328 B1 | 1/2001 | Mitchell et al. ............. 257/778 |
| 6,294,040 B1 | * 9/2001 | Raab et al. .................. 156/249 |
| 6,359,334 B1 | * 3/2002 | Jiang ......................... 257/706 |

FOREIGN PATENT DOCUMENTS

| | | |
|---|---|---|
| JP | 1-244652 | 9/1989 |
| JP | 2-105443 | 4/1990 |
| JP | 4-199723 | 7/1992 |

OTHER PUBLICATIONS

"ALT Leadframe Adhesive Tapes, Technical Information and Comparative Data," *Brady*, http://www.unit.ru/marking/alt.htm, pp. 1–7 (Feb. 23, 1999).
*Electronic Packaging and Interconnection Handbook*, New York, McGraw–Hill, Inc., pp. 2.2–2.7.

* cited by examiner

*Primary Examiner*—Carl Whitehead, Jr.
*Assistant Examiner*—Nema Berezny
(74) *Attorney, Agent, or Firm*—Dorsey & Whitney LLP

(57) ABSTRACT

A semiconductor package structure for a ball grid array type package using a plurality of pieces of adhesive elastomer film to attach a semiconductor die to a substrate having conductive traces in order to alleviate thermal mismatch stress between the semiconductor die and the printed circuit board to which the packaged device is soldered, while maintaining the reliability of the packaged device itself.

8 Claims, 3 Drawing Sheets

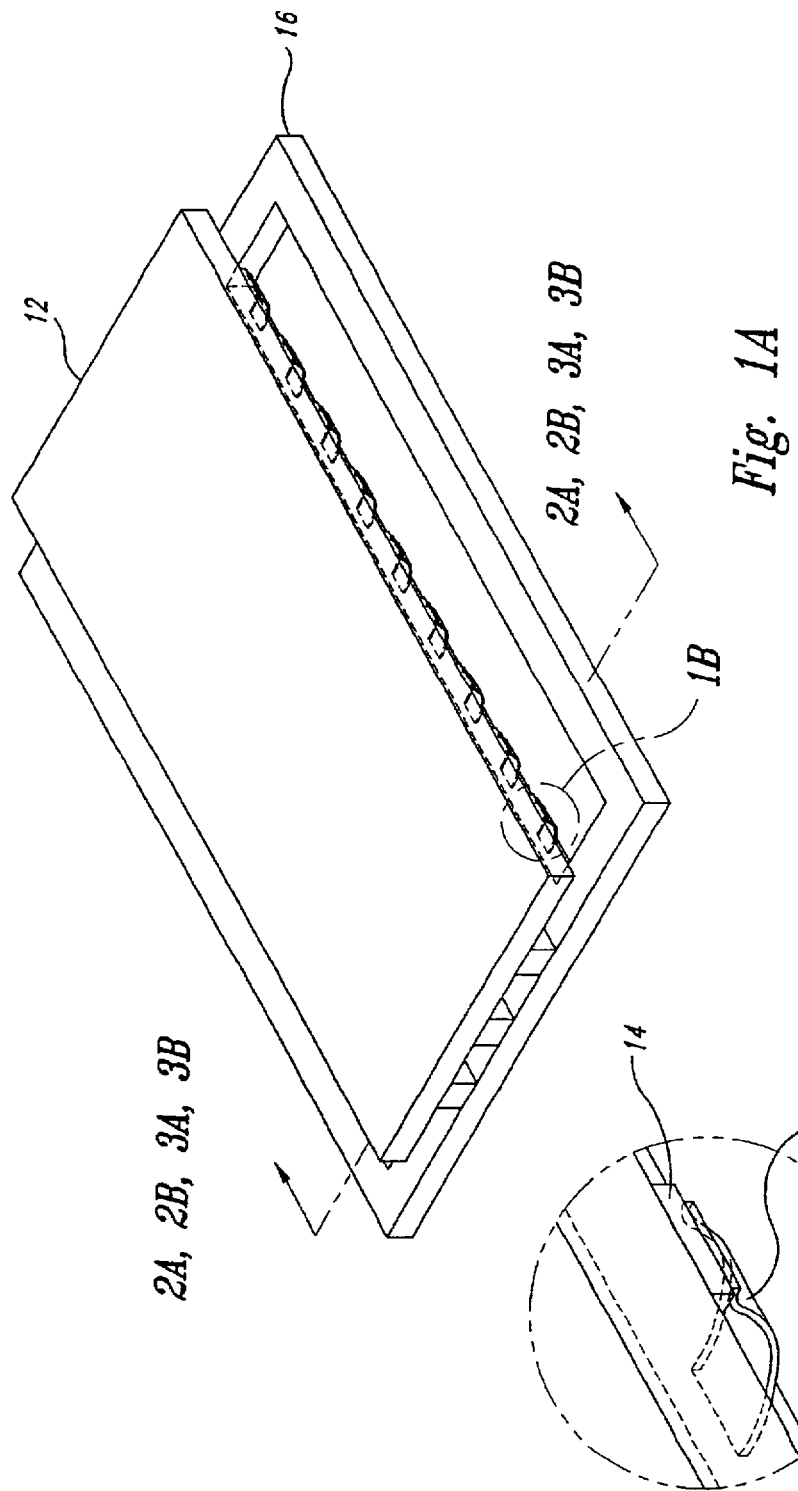

$L_0, \text{MULTIPLE} = L_{0,1} + L_{0,2} + L_{0,3}$

METHOD AND STRUCTURE FOR MANUFACTURING IMPROVED YIELD SEMICONDUCTOR PACKAGED DEVICES

CROSS-REFERENCE TO RELATED APPLICATION

This application is a divisional of U.S. patent application Ser. No. 09/365,356, filed Jul. 30, 1999 now U.S. Pat. No. 6,774,480.

TECHNICAL FIELD

The present invention relates to semiconductor packaging, and more particularly, to attaching a semiconductor die in a device package.

BACKGROUND OF THE INVENTION

Semiconductor devices are typically fabricated on thin wafers of silicon. Several dice are produced on each wafer, with each die representing a single semiconductor device. Each die on a wafer is tested for gross functionality, and sorted according to whether the die passes or fails the gross functionality test. After being sorted according to gross functionality, the wafers are cut using a wafer saw, and the individual die are singulated. The die determined to be non-functional are scrapped. The functional die are packaged and further tested to ensure that each packaged device satisfies a minimum level of performance. Typically, the functional devices are permanently packaged by encapsulating the die in a plastic package. Packaging of the functional devices facilitates handling of the devices and also protects the die from damage during the manufacture of circuits using the packaged devices.

There are several conventional structures and methods for packaging singulated die. For example, more common package types include small outline j-bend (SOJ) packages, thin small outline packages (TSOP), and zigzag in-line packages (ZIP). The finished packaged devices are often mounted onto a substrate to form a module. A singulated die is packaged in the aforementioned package types by attaching the die to a lead frame paddle and electrically coupling exposed bond pads of the die to metal leads. The lead frame, die, and a portion of the metal leads are subsequently encapsulated by a plastic resin to protect the integrated circuit from damage. The encapsulated device is then trimmed from the lead frame and the metal leads formed to the correct shape.

An alternative lead frame structure, known as lead on chip (LOC) may be employed instead of the structure having a lead frame paddle. In an LOC structure, individual metal leads are typically attached to the surface of the die using double-sided adhesive tape having a polyimide base coated on both sides with adhesive material. The metal leads and die are then heated to attach to the adhesive material. The bond pads of the semiconductor die are subsequently wire bonded to a respective metal lead to electrically connect the semiconductor die to receive electrical signals applied to the conductive leads. The LOC lead frame and die are then encapsulated in a plastic resin, then followed by a trim and form process. The LOC structure and packaging process are described in U.S. Pat. No. 4,862,245 to Pashby et al., issued Aug. 29, 1989, and U.S. Pat. No. 4,916,519 to Ward, issued Apr. 10, 1990, which are incorporated herein by reference.

Recently, semiconductor manufacturers have developed a package structure where unpackaged die are mounted directly onto a substrate, for example, a printed circuit board, thus allowing modules to be designed with increased device density. Examples of these types of packages structures include ball grid array (BGA) packages, and other chip scale packages (CSP) having package dimensions that are slightly larger than the dimension of the encapsulated die. The die is mounted onto the substrate and is electrically coupled to conductive traces formed on the substrate by wire bonding the bond pads of the die. Alternatively, the conductive traces and the bond pads may be electrically coupled by using tape automated bonded (TAB) wire instead. The resulting structure is subsequently, partially or entirely, encapsulated to protect the device from damage. External leads, often in the form of solder balls, are then attached to attachment sites on the conductive traces so that the integrated circuit fabricated on the die may be electrically contacted through the external leads.

Following packaging, the device is typically mounted onto a printed circuit board (PCB) as a component in a larger electronic system. Conductive pads on the PCB are positioned to correspond to the location of the external leads of the packaged device. The packaged device is positioned accordingly onto the conductive pads and subjected to a reflow process at an elevated temperature in order to solder the packaged device to the PCB. In the case of a BGA type package, the solder is provided by the solder balls of the completed package.

After the solder has cooled, the packaged device is rigidly attached to the PCB. However, there may be an issue with regards to the reliability of the solder joints as a result of the different expansion rates of the semiconductor die of the packaged device and the PCB to which the packaged device is soldered. The coefficient of thermal expansion (CTE) of the die is typically much lower than that for the PCB. Thus, when the electronic system reaches its operating temperature, the PCB will expand more than the die. The thermal mismatch results in a shearing stress focused at the interface between the packaged device and the PCB, namely, the solder joints. The reliability of the electronic system is compromised when the thermal mismatch stress applied to the solder joints of the packaged device is great enough to cause one of the solder joints to fail.

One method that has been used to alleviate some of the thermal mismatch stress at the solder joint is using a package structure where the die is attached to a flexible substrate using a compliant elastomer pad. Upon reaching operating temperature, the PCB will expand and laterally shift the position of the contact pads with respect to the die. The compliant nature of the elastomer pad allows the solder balls of the packaged device to shift laterally with the expanding PCB. Thus, the different expansion rates of the die in the packaged device, and the PCB to which the packaged device is soldered, is accommodated by the flexible elastomer pad attaching the die to the flexible substrate. However, in the case where TAB wire connections are used in such a package structure to electrically couple the bond pads of the die to the conductive traces of the substrate, thermal expansion of the elastomer pad creates reliability problems for the packaged device itself. It has been shown in reliability testing that the TAB wire joint is the point most susceptible to failure when the packaged device is subjected to temperature cycle tests (e.g., −65° C. to +150° C.) or high temperature and humidity tests (e.g., 85° C., 85% RH, alternating bias). Thermal expansion of the elastomer pad laterally shifts the position of the flexible substrate relative to the bond pads of the die. Consequently, the resulting compliant structure places stress at the TAB wire joint where the wire is bonded to the bond pad of the die.

Another method that has been used to minimize thermal mismatch stress between the die and the PCB is to attach the die to a flexible substrate with elastomer posts. One example of this type package is a product developed by Tessera called μBGA®. Viscous elastomer material is screen printed onto the flexible substrate and cured to form the elastomer posts. A dry or wet die attach adhesive is then applied to the end of the cured elastomer in order to attach the die to the elastomer posts. Subsequently, the bond pads of the die are electrically coupled to the conductive traces of the flexible substrate by a TAB wiring process. Although the resulting compliant structure accommodates the different expansion rates of the die and the PCB, the assembly process is time-consuming. Additional assembly steps are required to screen print the viscous elastomer material onto the flexible substrate, to cure the viscous material, and to apply the dry adhesive to the resulting elastomer post. As a result, product throughput at the assembly stage is reduced.

Furthermore, attaching the die to the substrate using elastomer posts requires precision processing to maintain assembly yields. In typical CSP type packages, coplanarity of the die and the substrate should be maintained to ensure that all solder balls contact the PCB upon reflow. Thus, the height of the elastomer posts should be substantially the same in order to achieve the required coplanarity. However, precision processing and equipment is required to achieve this level of consistency. Variations in the screen printing process or in the attachment of dry adhesive to the elastomer posts may result in unacceptable coplanarity, and consequently, unacceptable packaged devices.

Therefore, there is the need for a method and structure for a semiconductor package that can alleviate thermal mismatch stress without compromising the reliability of the package structure or adding several additional process steps.

SUMMARY OF THE INVENTION

The present invention is directed to a high reliability semiconductor package structure. The package structure is a ball grid array type package that uses a plurality of pieces of adhesive film to attach a semiconductor die to a substrate having conductive traces in order to alleviate thermal mismatch stress between the semiconductor die and the printed circuit board to which the packaged device is soldered, while maintaining the reliability of the packaged device itself.

BRIEF DESCRIPTION OF THE DRAWINGS

FIGS. 1A–B is an isometric view of a semiconductor package structure according to an embodiment of the present invention.

DETAILED DESCRIPTION OF THE INVENTION

Figure 2A:
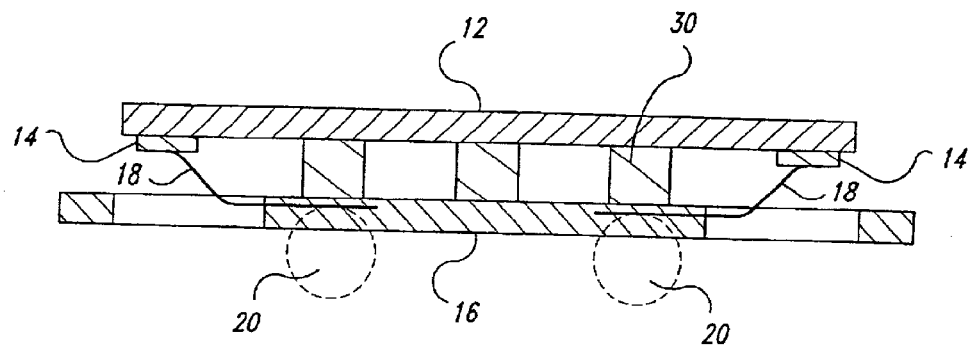
FIGS. 2A–B is a cross-sectional view of alternative embodiments of the semiconductor package structure shown in FIG. 1.

Embodiments of the present invention use a plurality of pieces of adhesive film to attach a semiconductor die to a substrate in a BGA type package. Using multiple pieces of adhesive film alleviates some of the thermal mismatch stress between the semiconductor die and the PCB to which the packaged device is soldered, while maintaining the reliability of the packaged device itself. As will be illustrated below, the sum change in the length of the pieces of adhesive film will be less than the change in the length of a elastomer pad of a conventional BGA package structure of similar size. Thus, the stress applied to the TAB wire joints caused by thermal expansion will be reduced with respect to the conventional package structure. The pieces of adhesive film are attached to the substrate by pressure bonding, and the die is subsequently pressure bonded to the opposite surface of the pieces of adhesive film. Coplanarity of the die and the substrate is maintained by the substantially uniform thickness of the pieces of adhesive film.

Shown in FIGS. 1 and 2 is a BGA type package structure 10 according to an embodiment of the present invention. A semiconductor die 12 having an integrated circuit (not shown) and conductive bond pads 14 fabricated on a surface of the die 12 is attached to a substrate 16. The substrate 16 has conductive traces 18, or interconnects, to which the bond pads 14 are coupled. The substrate 16 may be a rigid organic substrate, such as BT resin, or FR-4 or FR-5 material, or a flexible substrate, such as polyimide. A person of ordinary skill in the art will appreciate that the substrate 16 may formed from materials other than those described herein. Consequently, the type of material used for the substrate 16 does not limit the scope of the present invention.

External terminals 20, typically in the form of solder balls, will be formed on the opposite side of the substrate 16 and coupled to a respective conductive trace after the package structure 10 is encapsulated to protect the die 12 and substrate 16 from damage. The substrate 16 serves as an interposer coupling the bond pads 14 of the die 12 attached to one side to the external terminals 20 attached to the opposite side. The solder balls facilitate mounting the resulting packaged device onto a PCB, or similar surface.

A person of ordinary skill in the art will appreciate that the die 12 may be mounted face-up with the surface having the integrated circuit and bond pads 14 facing away from the substrate 16, or face-down so the surface with the integrated circuit and bond pads 14 are facing the substrate 16. The surface of the die 10 having the integrated circuit typically has a protective layer of polyimide or SiON to prevent the integrated circuit from being damaged during the die singulating process or the die attachment process. The orientation of the die 12 with respect to the substrate 16 will be determined by factors such as the method of bonding to the bond pads 14 or the encapsulation method.

The semiconductor die 12 is attached to the substrate 16 by a plurality of pieces of adhesive film 20a–c. As will be described in more detail below, the adhesive film may be formed from a compliant material. As shown in FIG. 1, there are three pieces of adhesive film 20a–c extending substantially the length of the die 12. However, a person of ordinary skill the art will appreciate that two or more pieces of adhesive film may be used to attach the die 12 to the substrate 16. It will also be appreciated that the configuration of the adhesive film is not limited to only single strips extending the length of the die 12 and the substrate 16. For example, each of the single strips may be separated into multiple pieces arranged along the length of the die. Alternatively, the pieces of adhesive film 20a–c may also be arranged at right angles near the corners of the die 12, or oriented to extend across the width of the die 12. Therefore, the number of pieces of adhesive film used to attach the die 12 to the substrate 16, or the particular orientation of the pieces of adhesive film should not limit the scope of the present invention.

The package structure 10 also includes a number of additional components that have been omitted from FIG. 1 in the interests of brevity. For example, an encapsulation material that may fill the space remaining between the adhesive film 20a–c, and substantially cover the die 12 and the substrate 16, are not illustrated in FIG. 1. However, methods and materials used for completing the assembly of the package structure 10 are well known in the art, and will not be discussed in detail herein.

Figure 2B:
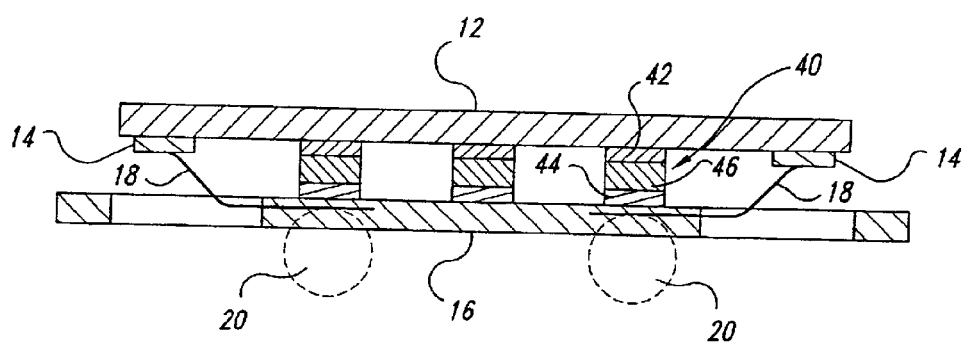

Shown in FIGS. 2A–B are alternative embodiments of the pieces of adhesive film that may be used to attach the die 12 to the substrate 16. FIG. 2A illustrates a film 30 consisting of a single layer of elastomer material. No additional layers of adhesive are required for the film 30 because the elastomer material is itself adhesive. The film 30 is pressure bonded to the substrate 16, and then the die 12 is pressure bonded to the film 30. The resulting structure is subjected to a relatively high temperature process to ensure that the die 12 is firmly attached to the substrate 16. As will be explained in greater detail below, the use of multiple pieces of the film 30 to attach the die 12 to the substrate 16 will reduce the stress at the bond wire joint caused by the thermal expansion of the elastomer material.

FIG. 2B illustrates a film 40 that may also be used in embodiments of the present invention. The film 40 includes two adhesive layers 42 and 44, and a carrier layer 46. Unlike the elastomer post method, where the elastomer post is formed initially, and an adhesive is applied subsequently, the film 40 is applied to the substrate 16 as a single film. The film 40 is adhered to the substrate 16, and the die 12 is adhered to the film 40 by pressure bonding. The resulting package structure is subsequently heated to firmly attach the die 12 to the substrate 16. Although the carrier layer 46 is shown in FIG. 2B as consisting of a single layer, a person of ordinary skill in the art will appreciate that the carrier layer 46 may be formed from multiple layers if so desired.

Using either the film 30 or 40 as a means of die attachment provides benefits over the elastomer post method described above. The film 30 or 40 is positioned on and pressure bonded to the substrate 16 using conventional techniques. No additional curing steps or application of adhesives are necessary. Additionally, with regards to the coplanarity of the die 12 and the substrate 16, the films 30 and 40 are not as susceptible to the problems related to coplanarity as the method of screen printing discrete elastomer posts onto the surface of the substrate 16. Consequently, assembly failures related to the coplanarity of the two surfaces may be reduced when multiple pieces of the film 30 or 40 are used for die attachment.

Figure 3A:
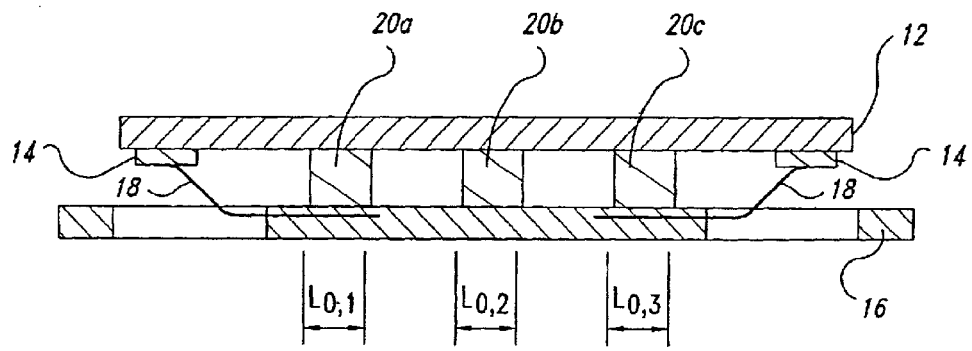
FIGS. 3A–B is a cross-sectional view of the semiconductor package structure shown in FIG. 1 and a conventional semiconductor package structure
Figure 3B:
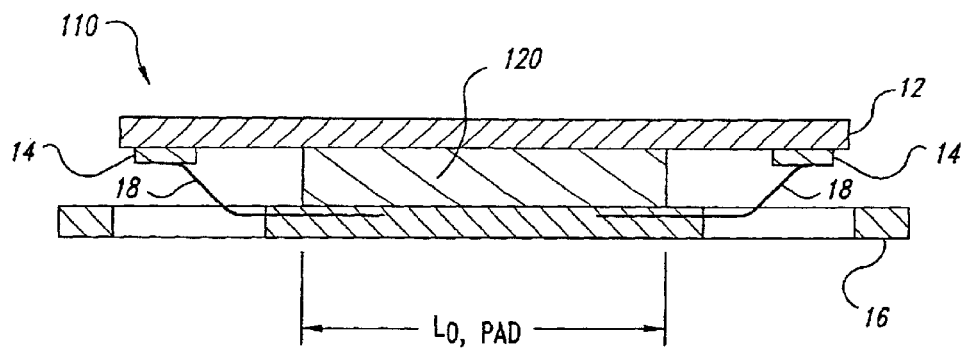

Shown in FIGS. 3A–B are cross-sectional views of the package structure 10 of FIG. 1, and a conventional package structure 110 having an elastomer pad 120 attaching the die 12 to the substrate 16. The thermal expansion for the multiple pieces of adhesive film 20a–c and the elastomer pad 120 are both governed by the following equation:

$$\Delta l = \alpha \Delta T l_0$$

where $\Delta l$ is the change in the length of the material, $\alpha$ is the coefficient of thermal expansion (CTE) of the material, $\Delta T$ is the change in temperature, and $l_0$, is the original length of the material at room temperature. For the purposes of illustration, assume that the same elastomer material is used for the elastomer pad 120 and the multiple pieces of adhesive film 20a–c, and that both structures are subjected to the same change in temperature. Consequently, the only difference between the change in length for the elastomer pad, $\Delta l_{pad}$, and for the multiple pieces of elastomer, $\Delta l_{multiple}$, is the original length of the corresponding elastomer pad, $l_{0,\,pad}$ and $l_{0,\,multiple}$. The $l_{0,\,pad}$ is the width of the elastomer pad 120, and the $l_{0,\,multiple}$ is the sum of the individual widths of pieces 20a–c, $l_{0,\,20a}$, $l_{0,\,20b}$, and $l_{0,\,20c}$, respectively. As illustrated by FIGS. 2A–B, $l_{0,\,pad} > l_{0,\,multiple}$, and therefore, $\Delta l_{pad} > \Delta l_{multiple}$. Thus, any stress applied to the wire bond joint due to the thermal expansion of the elastomer pad 120 may be reduced by using multiple pieces of elastomer film 20a–c.

From the foregoing it will be appreciated that, although specific embodiments of the invention have been described herein for purposes of illustration, various modifications may be made without deviating from the spirit and scope of the invention. For example, each of the embodiments described previously may be simultaneously performed on several substrates 16 connected in strip form to facilitate the mass production of the packaged devices. The individual packaged devices may be singulated following solder ball attachment. Accordingly, the invention is not limited except as by the appended claims.

What is claimed is:

1. A method for assembling a device package assembly for a semiconductor die, comprising adhering a semiconductor die having at least one conductive bond pad to a surface of a polymeric interposer having at least one conductive interconnect with a plurality of non-interconnected strips of compliant adhesive film, the strips extending substantially along a length of the die and having respective widths, a sum of the respective widths being substantially less than a width of the die; and heating the package assembly after adhering the semiconductor die to the compliant adhesive film to firmly attach the semiconductor die to the interposer prior to electrically coupling the bond pad to the conductive interconnect.

2. The method of claim 1, further comprising injecting into regions remaining in between the semiconductor die and the interposer an encapsulating material.

3. The method of claim 1, further comprising bonding the electrically conductive interconnect to the bond pad.

4. The method of claim 1, further comprising coupling the electrically conductive interconnect to an external conductive terminal located on a surface of the interposer opposite of the surface on which the semiconductor die is adhered.

5. A method for assembling a device package assembly for a semiconductor die, comprising adhering a semiconductor die having at least one conductive bond pad to a surface of a polymeric interposer having at least one conductive interconnect with a plurality of non-interconnected strips of compliant adhesive film, the strips extending substantially and continuously along a length of the die and having respective widths, a sum of the respective widths being substantially less than a width of the die; and heating the package assembly after adhering the semiconductor die to the compliant adhesive film to firmly attach the semiconductor die to the interposer prior to electrically coupling the bond pad to the conductive interconnect.

6. The method of claim 5, further comprising injecting an encapsulating material into a region between the semiconductor die and the interposer.

7. The method of claim 5, further comprising bonding the electrically conductive interconnect to the bond pad.

8. The method of claim 5, further comprising coupling the electrically conductive interconnect to an external conductive terminal located on a surface of the interposer opposite of the surface on which the semiconductor die is adhered.

* * * * *